(12) United States Patent
Wang et al.

(10) Patent No.: US 9,230,871 B1
(45) Date of Patent: Jan. 5, 2016

(54) TEST KEY STRUCTURE AND TEST KEY GROUP

(71) Applicant: UNITED MICROELECTRONICS CORP., Hsin-Chu (TW)

(72) Inventors: Chien-Kuo Wang, Hsinchu (TW); Chun-Liang Hou, Hsinchu County (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/489,460

(22) Filed: Sep. 17, 2014

(30) Foreign Application Priority Data

Aug. 12, 2014 (CN) .......................... 2014 1 0394926

(51) Int. Cl.
*H01L 23/58* (2006.01)
*H01L 21/66* (2006.01)
*H01L 27/088* (2006.01)

(52) U.S. Cl.
CPC .............. *H01L 22/32* (2013.01); *H01L 27/088* (2013.01)

(58) Field of Classification Search
CPC .... H01L 21/67242; H01L 22/30; H01L 22/34
See application file for complete search history.

(56) References Cited

U.S. PATENT DOCUMENTS

| 6,707,064 | B2 | 3/2004 | Jang et al. |
| 8,179,155 | B2 | 5/2012 | Tseng |
| 2011/0050275 | A1* | 3/2011 | Mollat et al. ............. 324/762.05 |

* cited by examiner

*Primary Examiner* — Elias M Ullah
(74) *Attorney, Agent, or Firm* — Winston Hsu; Scott Margo

(57) ABSTRACT

A test key structure includes a plurality of transistors formed on a scribe line of a wafer and arranged in a 2*N array having 2 columns and N rows. The transistors arranged in the 2*N array respectively includes a gate, a source, a drain, and a body. All of the sources of the transistors arranged in the 2*N array are electrically connected to each other.

11 Claims, 4 Drawing Sheets

TEST KEY STRUCTURE AND TEST KEY GROUP

BACKGROUND OF THE INVENTION

1. Field of the Invention

The invention relates to a test key structure and a test key group, and more particularly, to a test key structure and a test key group arranged in array.

2. Description of the Prior Art

In semiconductor fabrication, semiconductor devices or integrated circuits (ICs) are continuously tested in every step so as to maintain device quality. Generally, testing circuit and test key structures are fabricated in a scribe line of a wafer or on a monitor wafer simultaneously with the forming of actual or functional devices in the product wafer so that the fabricating processes are stimulated and the quality of the actual devices are checked by providing and electrically connecting the test pads to an external circuit or pins/probes of a probe card in test steps.

Please refer to FIG. 1, which is a schematic drawing illustrating a conventional test key structure. As shown in FIG. 1, a conventional test key structure 100 is positioned on a scribe line 104 of a wafer 102. The test key structure 100 includes a plurality of electronic elements 110, such as transistors for testing. Each of the electronic elements 110 is electrically connected to four pads 122/124/126/128. In detail, the four pads 122/124/126/128 are electrically connected to a source (not shown), a drain (not shown), a gate (not shown), and a body (not shown) of the electronic element 110 by metal wires 130 in sequence. Furthermore, the electronic element 110 of the test key structure 100 and the pads 122/124/126/128 are arranged in a linear pattern on the scribe line 104.

Please refer to FIG. 1 again. It is observed that each electronic element 110 of the test key structure requires four pads 122/124/126/128 that is large enough so that the probe can contact the pads 122/124/126/128 with ease. However, the four large pads 122/124/126/128 occupy large and valuable areas of the wafer 102. More important, since large areas are required to accommodate the large pads, amount of the electronic elements 110 for testing cannot be increased, and thus test sample size cannot be increased either. There is therefore an imperative issue to provide a test key structure with increased sample size.

SUMMARY OF THE INVENTION

According to the claimed invention, a test key structure is provided. The test key structure includes a plurality of transistors formed on a scribe line of a wafer and arranged in a 2*N array having 2 columns and N rows. Each of the transistors includes a gate, a source, a drain and a body. All of the sources of the transistors are electrically connected to each other.

According to the claimed invention, a test key group is provided. The test key group includes plural sets of test structures formed on a scribe line of a wafer and a plurality of pads formed on the scribe line of the wafer. Each set of test key structures includes a plurality of transistors arranged in a 2*N array having 2 columns and N rows, and each of the transistors includes a gate, a source, a drain and a body. The sources of the transistors in each set are electrically connected to each other.

According to the claimed invention, another test key structure is provided. The test key structure includes a plurality of first transistors arranged in a first column and a plurality of second transistors arranged in a second column. Each first transistor includes a first gate, a first source, a first drain and a first body, and each second transistor includes a second gate, a second source, a second drain and a second body. A size of the second transistors is different from a size of the first transistors. Furthermore, the first sources of the first transistors and the second sources of the second transistors are electrically connected to each other.

Accordingly, the sets of test key structures provided by the present invention respectively includes 2*N transistors for testing, and the sources of the 2*N transistors are electrically connected to each other. More important, those sources electrically connected to each other are further electrically connected to a source pad. Additionally, the pads and the sets of test key structures are arranged in a linear pattern to form the test key group on the scribe line. It is noteworthy that the test key structures and the test key group of the present invention provide increased sample size by positioning sufficient pads and more devices for testing on the scribe line. Consequently, test reliability is improved due to the increased sample size.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
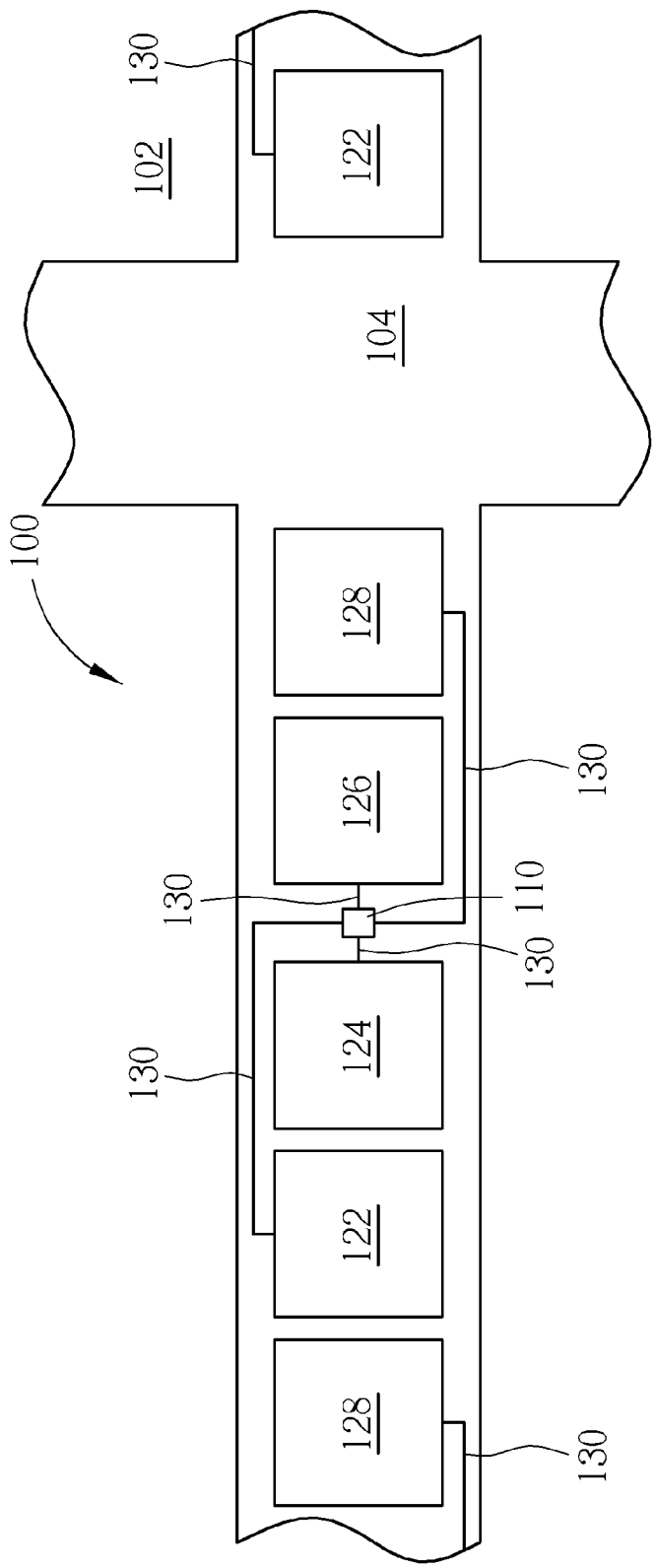
FIG. 1 is a schematic drawing illustrating a conventional test key structure.
Figure 2:
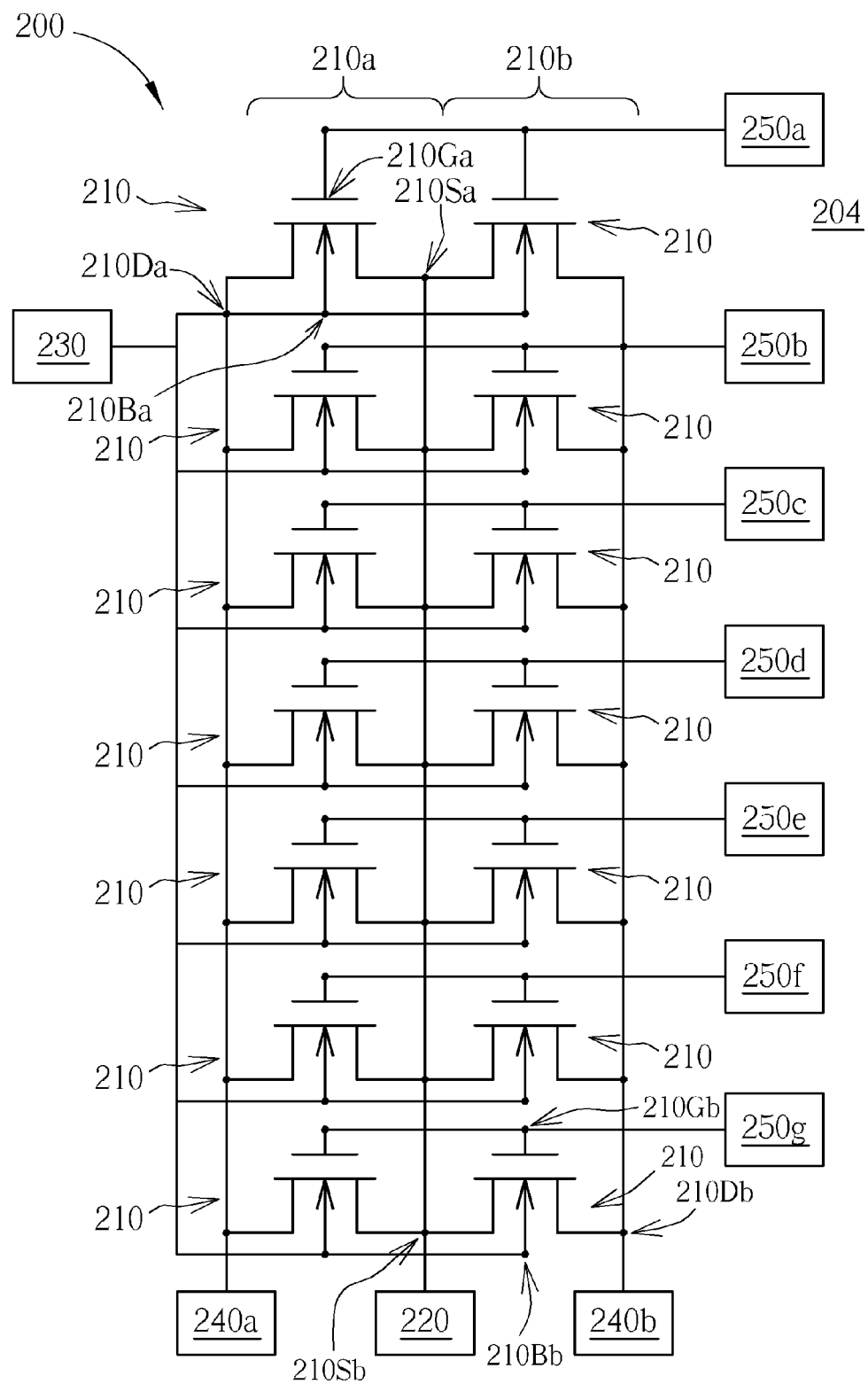
FIG. 2 is a circuit diagram of a test key structure provided by a preferred embodiment of the present invention.
Figure 3:
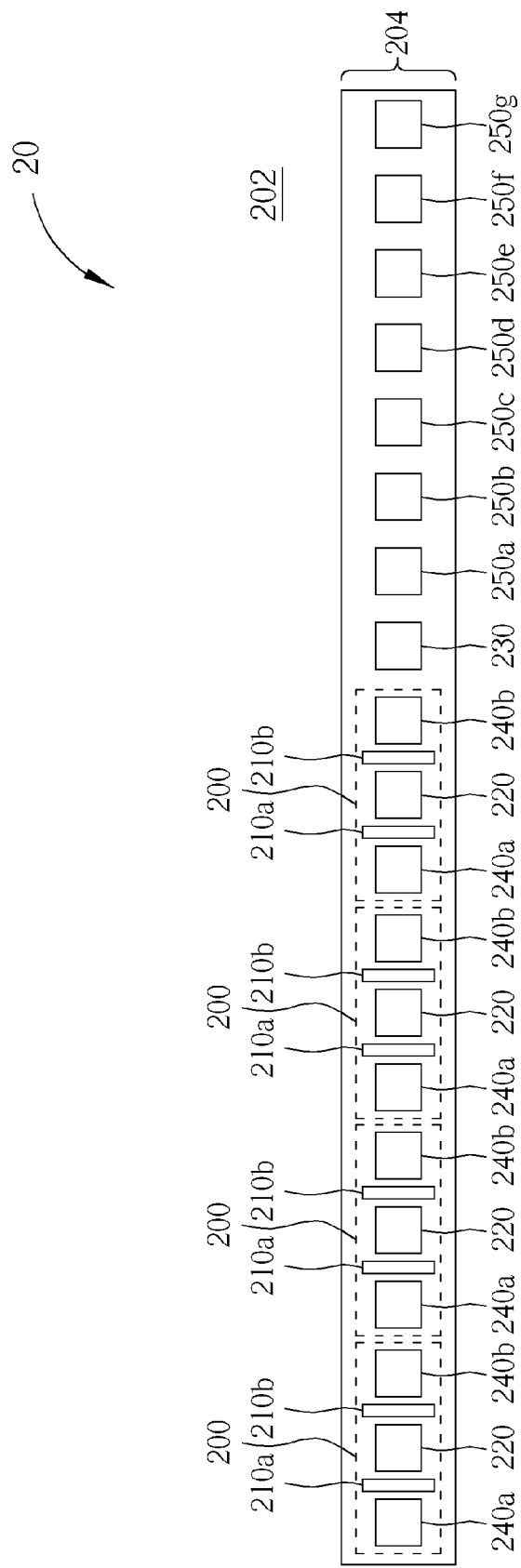
FIG. 3 is a schematic drawing illustrating the test key structures and a test key group provided by the preferred embodiment of the present invention.

Please refer to FIGS. 2 and 3, FIG. 2 is a circuit diagram of a test key structure provided by a preferred embodiment of the present invention, and FIG. 3 is a schematic drawing illustrating the test key structures and a test key group provided by a preferred embodiment of the present invention. As shown in FIG. 2, the preferred embodiment provides a test key structure 200 including a plurality of transistors 210 formed on a scribe line 204 of a wafer 202. It is noteworthy that the transistors 210 are arranged in a 2*N array, and the 2*N array includes two columns and N rows. According to the preferred embodiment, N is 7. That is, there are 14 transistors 210 arranged in a 2*7 array having 2 columns and 7 rows. However, it should be easily realized by those skilled in the art that the amount of the rows "N" is not limited to this. The amount of the rows "N" can be any positive integer depending on different product requirements. As shown in FIGS. 2 and 3, the transistors 210 of the test key structure 200 provided by the preferred embodiment are arranged in two columns. Specifically, the transistors 210 arranged in one of the two columns (taken as a first column) are defined as a plurality of first transistors 210a and the transistors 210 arranged in the other column (taken as a second column) are defined as a plurality of second transistors 210b. The first transistors 210a arranged in the first column are parallel with the second transistors 210b arranged in the second column. Additionally, sizes of the first transistors 210a are the same as sizes of the second transistors 210b in accordance with the preferred embodiment.

Please refer to FIGS. 2 and 3 again. According to the preferred embodiment, each of the first transistors 210a includes a first gate 210Ga, a first source 210Sa, a first drain 210Da and a first body 210Ba. And each of the second transistors 210b includes a second gate 210Gb, a second source 210Sb, a second drain 210Db and a second body 210Bb. It is noteworthy that in the test key structure 200 provided by the preferred embodiment, all of the first sources 210Sa of the first transistors 210a and all of the second sources 210Sb of the second transistors 210b are electrically connected to each other. More important, the first sources 210Sa and the second sources 210Sb are further electrically connected to a source pad 220 formed on the scribe line 204. As shown in FIGS. 2 and 3, the source pad 220 is positioned between the first column formed by the first transistors 210a and the second column formed by the second transistors 210b. Consequently, distances between the source pad 220 and the first source 210Sa of each first transistor 210a are equal to distances between the source pad 220 and the second source 210Sb of each second transistor 210b. The first bodies 210Ba of the first transistors 210a and the second bodies 210Bb of the second transistors 210b are electrically connected to each other. The first bodies 210Ba and the second bodies 210Bb are further electrically connected to a body pad 230 formed in the scribe line 204, as shown in FIG. 2.

Please still refer to FIGS. 2 and 3. The first drains 210Da of the first transistors 210a are electrically connected to each other and further electrically connected to a first drain pad 240a formed on the scribe line 204. The second drains 210Db of the second transistors 210b are electrically connected to each other and further electrically connected to a second drain pad 240b formed on the scribe line 204. As shown in FIG. 3, the first transistors 210a arranged to form the first column are positioned between the first drain pad 240a and the source pad 220, and the second transistors 210b arranged to form the second column are positioned between the source pad 220 and the second drain pad 240b. Furthermore, the first gate 210Ga of the first transistor 210a and the second gate 210Gb of the second transistor 210b arranged in the same row are electrically connected to each other and further electrically connected to a gate pad formed on the scribe line 204. It is noteworthy that the preferred embodiment includes a plurality of gate pads, and an amount of the gate pads is equal to the amount of the rows "N" in the test key structure 200. For example, the test key structure 200 provided by the preferred embodiment includes 7 rows, therefore there are 7 gate pads 250a-250g formed on the scribe line 204. Accordingly, the first gate 210Ga and the second gate 210Gb in the first row are electrically connected to each other and further electrically connected to the gate pad 250a. The first gate 210Ga and the second gate 210Gb in the second row are electrically connected to each other and further electrically connected to the gate pad 250b. The first gate 210Ga and the second gate 210Gb in the third row are electrically connected to each other and further electrically connected to the gate pad 250c. And so forth, the first gate 210Ga and the second gate 210Gb in the seventh row are electrically connected to each other and further electrically connected to the gate pad 250g.

Please still refer to FIGS. 2 and 3. The preferred embodiment provides a test key group 20 and the test key group 20 includes plural sets of test key structures 200 while each set of test key structures 200 includes the transistors 210 arranged in two columns, the first drain pad 240a, the source pad 220, and the second drain pad 240b as shown in FIG. 2. It is noteworthy that sources (including the first sources 210Sa and the second sources 210Sb) in each set of test key structures 200 are electrically connected, but electrically isolated from sources in other sets of test key structures 200.

More important, an amount of the sets of test key structures 200 in the test key group 20 is defined by an equation below according to the preferred embodiment:

$$N_P = 3*N_S + 1 + N \quad \text{(equation)}$$

wherein $N_P$ denotes the amount of the pads, $N_S$ denotes the amount of the sets of test key structures 200, and N denotes an amount of the rows in each set. It is noteworthy that the pads includes all of the first drain pads 240a, the second drain pads 240b, the source pads 220, the body pad 230, and the gate pads 250a-250g in the test key group 20. Furthermore, the amount of the pads $N_P$ is equal to a pin number of a probe card for performing test. For example, when a probe card including 20 pins is used in the preferred embodiment, the amount of the pads $N_P$ is 20. And each set of test key structures 200 is predetermined to include 7 rows. Accordingly, the amount of the set $N_S$ in the test key group 20 is 4. Therefore the test key group 20 provided by the preferred embodiment includes 4 sets of test key structures 200, and an amount of the transistors 210 in the preferred embodiment is a product of the two columns and the 7 rows and the 4 sets, that means there are 56 transistors 210 in accordance with the preferred embodiment. In other words, the test key group 20 provides 56 devices for testing. In a modification to the preferred embodiment, a probe card including 20 pins is used, therefore the amount of the pads $N_P$ is 20. And each set of test key structures 200 is predetermined to include 4 rows. Accordingly, the test key group 20 provided by the modification includes 5 sets of test key structures 200 and an amount of the transistors 210 in the modification is a product of the 2 columns and the 4 rows and the 5 sets, that means there are 40 transistors 210 in the modification. In other words, the test key group 20 provides 40 devices for testing.

Additionally, since each set of test key structures 200 includes one first drain pad 240a, one second drain pad 240b and one source pad 220, an overall amount of the drain pads (including all of the first drain pads 240a and all of the second drain pads 240) in the test key group 20 is two times of the amount $N_S$ of the sets of test key structures 200. An overall amount of the source pads 220 in the test key group 20 is equal to the amount $N_S$ of the sets of test key structures 200. Furthermore, in each set of test key structures 200, distances between the first sources 210Sa and the source pad 220 are equal to distances between the second sources 210Sb and the source pad 220. It is noteworthy that distances between the sources (including the first sources 210Sa and the second source 210Sb) and the source pad 220 are substantially equal even in different sets. Furthermore, it is well-known those skilled in the art that IR drop issue, which refers to a voltage drop caused by the resistance of the power traces, is worse and unpredictable if the distances between the pad and two transistors are different. Consequently, variation due to IR drop cannot be ignored and thus test interpretation is adversely impacted. In each set of test key structures 200 in the test key group 20, the distances between the source pad 220 and the first sources 210Sa of the first transistors 210a arranged in the first column is equal to the distances between the source pad 220 and the second sources 210Sb of the second transistors 210b arranged in the second column, therefore IR drops between the source pad 220 and the transistors 210a/210b are almost the same. In other words, variation due to IR drop issue is mitigated according to the preferred embodiment.

It is also noteworthy that in the test key group 20, a size of the transistors 210 in each set of test key structures 200 are the same, and a size of the transistors 210 in different sets of test key structures 200 of can be the same according to the preferred embodiment. However in a modification to the preferred embodiment, the size of the transistors 210 in at least one set of test key structures 200 can be different from the size of the transistors 210 in other sets of test key structures 200. Consequently, the modification provides elements of different sizes for testing and thus test flexibility is improved.

According to the test key structure 200 and the test key group 20 provided by the preferred embodiment, the sources 210Sa/210Sb in each set of test key structures 200 are electrically connected to one source pad 220, and the drains 210Da/210Db in the two columns in each set of test key structures 200 are electrically connected to the first drain pad 240*a* and the second drain pad 240*b*, respectively. The gates 210Ga/210Gb arranged in the same row in different sets of test key structures 200 are electrically connected to one gate pad. In detail, in every set of test key structures 200, the first gate 210Ga and the second gate 210Gb in the first row are connected to the gate pad 250*a*, the first gates 210Ga and the second gates 210Gb in the second row are connected to the gate pad 250*b*, and so forth the first gates 210Ga and the second gates 210Gb in the seventh row are connected to the gate pad 250*g*. All of the bodies 210Ba/210Bb in the test key group 20 are electrically connected to one body pad 230. Consequently, the amount of the pads, which require and occupy large valuable area of the wafer, is reduced. As mentioned above, the test key group 20 of the preferred embodiment provides 56 transistors 210 for testing, but the test key group 20 requires only 20 pads. Comparing to the preferred embodiment, the conventional test key group requires 224 pads for 56 transistors. It is therefore conceivable that the test key structure 200 and the test key group 20 provided by the preferred embodiment efficaciously increase device density, reduce the amount of the required pads, and increase sample size.

Figure 4:
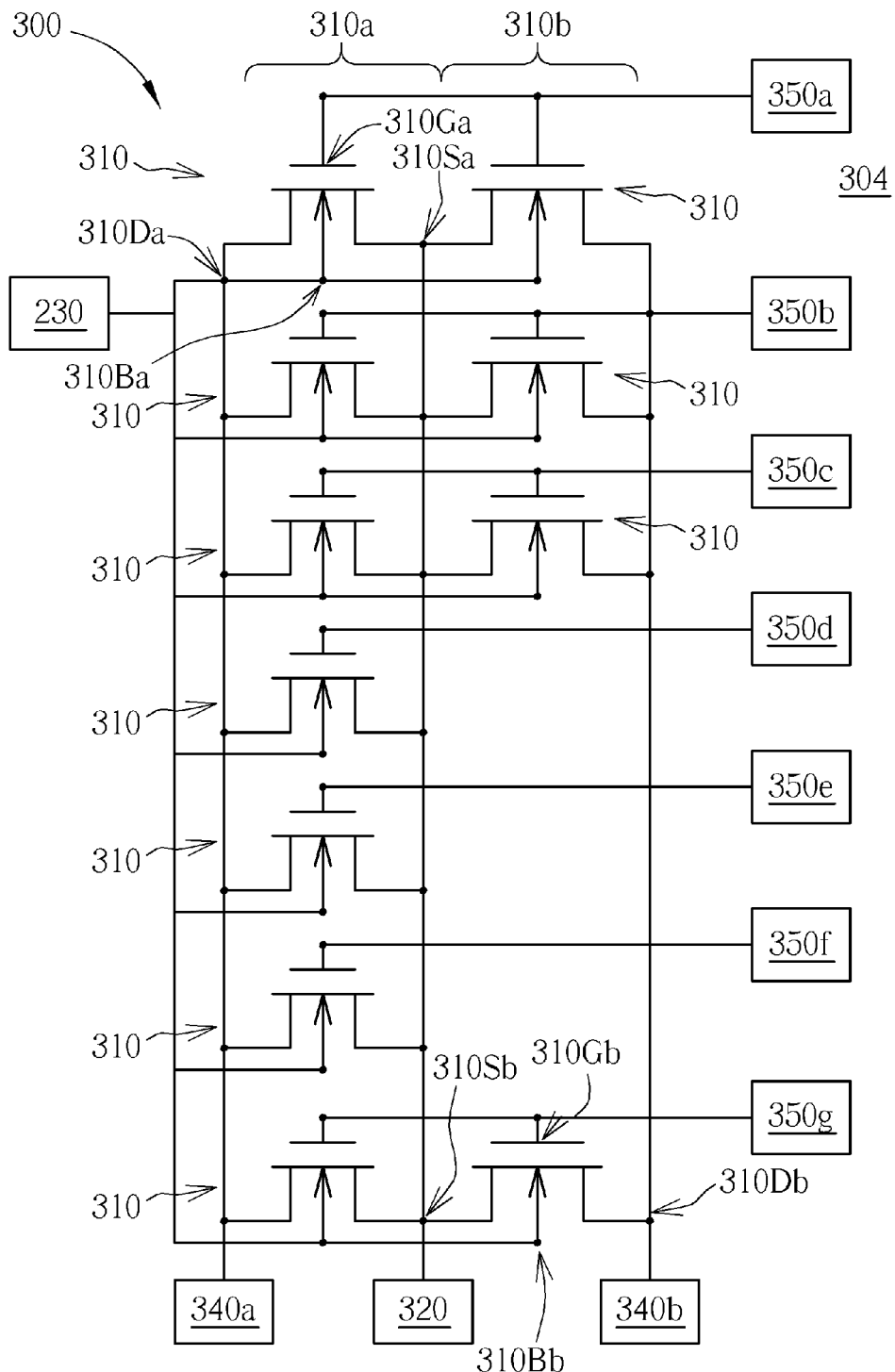
FIG. 4 is a circuit diagram of a test key structure provided by another preferred embodiment of the present invention.

Please refer to FIG. 4, which is a circuit diagram of a test key structure provided by another preferred embodiment of the present invention. As shown in FIG. 4, a test key structure 300 is provided by the preferred embodiment. The test key structure 300 includes a plurality of transistors 310 positioned on a scribe line 304 of a wafer. The transistors 310 are arranged in a 2*N array, and the 2*N array includes two columns and N rows. It is noteworthy that the amount of the rows "N" can be any positive integer depending on different product requirements. As shown in FIG. 4, the transistors 310 of the test key structure 300 provided by the preferred embodiment are arranged in two columns. Specifically, the transistors 310 arranged in one of the two columns (taken as a first column) are defined as a plurality of first transistors 310*a* and the transistors 310 arranged in the other column (taken as a second column) are defined as a plurality of second transistors 310*b*. In other words, the transistors 310 arranged in the first column are defined as the first transistors 310*a* and the transistors 310 arranged in the second column are defined as the second transistors 310*b*. As shown in FIG. 4, the first transistors 310*a* are parallel with the second transistors 310*b*. It is noteworthy that a size of the second transistors 310*b* is different from a size of the first transistors 310*a* in accordance with the preferred embodiment. Consequently, an amount of the transistors in the first column is different from an amount of the transistor in the second column. For example, since the size of the second transistors 310*a* is larger than the size of the first transistors 310*b*, there are 7 first transistors 310*a* arranged in the first column but only 4 second transistors 310*a* arranged in the second column as shown in FIG. 4, but not limited to this.

Please refer to FIG. 4 again. According to the preferred embodiment, each of the first transistors 310*a* includes a first gate 310Ga, a first source 310Sa, a first drain 310Da and a first body 310Ba. And each of the second transistors 310*b* includes a second gate 310Gb, a second source 310Sb, a second drain 310Db and a second body 310Bb. It is noteworthy that in the test key structure 300 provided by the preferred embodiment, all of the first sources 310Sa of the first transistors 310*a* and all of the second sources 310Sb of the second transistors 310*b* are electrically connected to each other. More important, the first sources 310Sa and the second sources 310Sb are further electrically connected to a source pad 320 formed on the scribe line 304. As mentioned in above embodiment, the source pad 320 is positioned between the first column formed by the first transistors 310*a* and the second column formed by the second transistors 310*b*. Therefore, distances between the source pad 320 and the first source 310Sa of each first transistor 310*a* are substantially equal to distances between the source pad 320 and the second source 310Sb of each second transistor 310*b*. The first bodies 310Ba of the first transistors 310*a* and the second bodies 310Bb of the second transistors 310*b* are electrically connected to each other. The first bodies 310Ba and the second bodies 310Bb are further electrically connected to a body pad 330 formed on the scribe line 304, as shown in FIG. 4.

Please still refer to FIG. 4. The first drains 310Da of the first transistors 310*a* are electrically connected to each other and further electrically connected to a first drain pad 340*a* formed on the scribe line 304. The second drains 310Db of the second transistors 310*b* are electrically connected to each other and further electrically connected to a second drain pad 340*b* formed on the scribe line 304. As shown in FIG. 4, the first transistors 310*a* arranged in the first column are positioned between the first drain pad 340*a* and the source pad 320, and the second transistors 310*b* arranged in the second column are positioned between the source pad 320 and the second drain pad 340*b*. In the case that there are two transistors 310, that are one first transistor 310*a* and one second transistor 310*b* arranged in the row, the first gate 310Ga of the first transistor 310*a* and the second gate 310Gb of the second transistor 310*b* are electrically connected to each other, and further electrically connected to a gate pad formed on the scribe line. In the case that there is only one transistor 310, that is the first transistor 310*a* or the second transistor 310*b* arranged in the row, the first gate 310Ga or the second gate 310Gb is electrically connected a gate pad formed on the scribe line 304. It is noteworthy that the preferred embodiment includes a plurality of gate pads, and an amount of the gate pads is equal to the amount of the rows "N" in the test key structure 300, no matter how many transistors are arranged in each row. For example, the test key structure 300 provided by the preferred embodiment includes 7 rows, therefore there are 7 gate pads 350*a*-350*g* formed on the scribe line 304.

It is also noteworthy that the preferred embodiment provides a test key group, and the test key group includes a plurality of pads and plural sets of test key structures 300, and each set of test key structures 300 includes the abovementioned elements. It is noteworthy that spatial relationship between the sets of test key structures and pads the similar with those described in the aforementioned preferred embodiment, therefore those details are omitted in the interest of brevity.

According to the test key structure 300 and the test key group provided by the preferred embodiment, the sources 310Sa/310Sb in each set of test key structures 300 are electrically connected to one source pad 320, the drains 310Da/310Db in the two columns in each set of test key structures 300 are electrically connected to the first drain pad 340a and alternatively the second drain pad 340b. The gates 310Ga/310Gb arranged in the same row in different sets of test key structures 300 are electrically connected to one gate pad. All of the bodies 310Ba/310Bb in the test key group are electrically connected to one body pad 330. Consequently, the amount of the pads, which require and occupy large valuable area of the wafer, is reduced. It is therefore conceivable that the test key structure 300 and the test key group provided by the preferred embodiment increase device density, reduce the amount of the required pads, and increase sample size.

Accordingly, any one set of test key structures provided by the present invention includes 2*N transistors for testing, and the sources of the 2*N transistors are electrically connected to each other. More important, those sources electrically connected to each other are further electrically connected to a source pad. Additionally, the test key structures and the pads are arranged in a linear pattern to form the test key group on the scribe line. It is noteworthy that the test key structures and the test key group of the present invention provide increased sample size by positioning sufficient pads and more devices for testing on the scribe line. Consequently, test reliability is improved due to the increased sample size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key group comprising:
    plural sets of test structures formed on a scribe line of a wafer, each set of test key structures comprising a plurality of transistors arranged in a 2*N array having 2 columns and N rows, and each of the transistors comprising a gate, a source, a drain and a body; and
    a plurality of pads formed on the scribe line, an amount of the pads being equal to a pin number of a probe card for performing test,
    wherein the sources of the transistors in each set are electrically connected to each other, and an amount of the sets of test key structures is defined by an equation below:

$$N_P = 3*N_S + 1 + N$$

Wherein $N_P$ denotes the amount of the pads, $N_S$ denotes the amount of the sets of test key structures, and N denotes an amount of the rows in each set.

2. The test key group according to claim 1, wherein the pads comprise a plurality of drain pads, a plurality of gate pads, a plurality of source pads and a body pad.

3. The test key group according to claim 2, wherein an overall amount of the drain pads is two times of the amount of the sets of test key structures, an overall amount of the source pads is equal to the amount of the sets of test key structures, and an overall amount of the gate pads is equal to an amount of the rows in each set of test key structures.

4. The test key group according to claim 2, wherein the source pads are respectively positioned in each set of test key structures and electrically connected to the sources of the transistors in that set of test key structures, and distances between the source pad and the sources in that set of test key structures are substantially identical.

5. The test key group according to claim 4, wherein distances between the sources and the source pad in different sets of test key structures are substantially equal.

6. The test key group according to claim 1, wherein a size of the transistors in at least one set of test key structures is different from a size of the transistors in other sets of test key structures.

7. A test key structure comprising:
    a plurality of first transistors arranged in a first column, and each first transistor comprising a first gate, a first source, a first drain, and a first body; and
    a plurality of second transistors arranged in a second column, and each second transistor comprising a second gate, a second source, a second drain, and a second body, a size of the second transistors is different from a size of the first transistors,
    wherein the first sources of the first transistors and the second sources of the second transistors are electrically connected to each other.

8. The test key structure according to claim 7, further comprising a first drain pad, a second drain pad and a source pad, the first transistors are positioned between the first drain pad and the source pad, the second transistors are positioned between the source pad and the second drain pad, and distances between the first sources and the source pad are substantially equal to distances between the second sources and the source pad.

9. The test key structure according to claim 7, wherein the first transistors and the second transistors are arranged in a 2*N array, and the 2*N array comprises the first column, the second column and N rows.

10. The test key structure according to claim 9, wherein the first gate and the second gate in the same row are electrically connected to a gate pad.

11. The test key structure according to claim 7, wherein the first bodies and the second bodies are electrically connected to a body pad.

* * * * *